United States Patent

Fendt et al.

[11] Patent Number: 5,812,565
[45] Date of Patent: Sep. 22, 1998

[54] METHOD FOR AUTOMATIC RECOGNITION AND CORRECTION OF AN INVALID DATA SET AND SYSTEM FOR CARRYING OUT THE METHOD

[75] Inventors: Günter Fendt; Peter Hora, both of Schrobenhausen; Hans Spies, Pfaffenhofen; Guido Wetzel, Neuburg; Derrick Zechmair, Schrobenhausen, all of Germany

[73] Assignee: Temic Telefunken Micro-Electric GmbH, Heilbronn, Germany

[21] Appl. No.: 677,658

[22] Filed: Jul. 8, 1996

[30] Foreign Application Priority Data

Jul. 11, 1995 [DE] Germany ................. 195 25 149.0

[51] Int. Cl.$^6$ ................................. G06F 11/00
[52] U.S. Cl. ............ 371/40.2; 371/40.18; 395/182.04
[58] Field of Search .................. 371/40.2, 40.18, 371/36, 68.1; 395/182.04, 185.07

[56] References Cited

U.S. PATENT DOCUMENTS

| 5,295,258 | 3/1994 | Jewett et al. ............... 395/182.1 |
| 5,452,441 | 9/1995 | Esposito et al. ........... 395/182.11 |

FOREIGN PATENT DOCUMENTS

| 0082533 | 6/1983 | European Pat. Off. . |
| 0615211 | 9/1994 | European Pat. Off. . |
| 3208763 | 11/1982 | Germany . |
| 3811736 | 10/1989 | Germany . |

OTHER PUBLICATIONS

Patent Abstracts of Japan, vol. 011, No. 194(P–588), 23 Jun. 1987 & JP 62 017852 A (Yokogawa Electric Corp) 26 Jan. 1987.

Patent Abstracts of Japan, vol. 011, No. 216(P–595), 14 Jul. 1987 & JP 62 034260 A (Canon Inc), 14 Feb. 1987.

Patent Abstracts of Japan, vol. 018, No. 690(P–1851), 26 Dec. 1994 & JP 06 27442 A (Kawamura Denki Sangyo KK), 30 Sep. 1994.

Primary Examiner—Stephen M. Baker
Attorney, Agent, or Firm—Paul J. Vincent

[57] ABSTRACT

The invention concerns a method for the automatic recognition and correction of an invalid data set stored in a programmable circuit memory which is part of a group of at least three identical stored data sets, wherein the data sets of the group are compared to each other, and in the event that one data set of the group does not agree with the remaining data sets of the group same is recognized as being invalid and the remaining agreeing data sets are recognized as being valid, and the invalid data set is corrected through replacement with a valid data set. The invention is also directed to a system adapted to carry out this method.

13 Claims, 2 Drawing Sheets

METHOD FOR AUTOMATIC RECOGNITION AND CORRECTION OF AN INVALID DATA SET AND SYSTEM FOR CARRYING OUT THE METHOD

BACKGROUND OF THE INVENTION

The invention concerns a method for automatic recognition and correction of an invalid data set stored in a programmable circuit memory and part of a group of at least three identical stored data sets.

Non-volatile stored data are necessary for the operation of a plurality of electronic apparatus, for example, for a control apparatus in a motor vehicle. In general, a part of these data are first generated during operation or during first operation; with a motor vehicle these are, for example, calibration data, error data, system clock data, and certain motor vehicle specific data. Data of this kind can therefore not be stored in a memory (ROM) previously programmed by the manufacturer. Rather, a programmable non-volatile memory must be provided for them within the circuit. Towards this end one could utilize, for example, an EEPROM (electrically erasable permanent memory), a combination of an EEPROM and a RAM (volatile read-write-memory) or a battery-buffered RAM.

Although these types of memories are, in general, quite reliable it is nevertheless possible for individual storage cells to "flip", i.e. to acquire a content different than that originally stored. For reasons of technical safety, system-critical and other important data are therefore normally stored a plurality of times to facilitate, by comparison, a self-diagnosis of the memory. It is, for example, known in the art of motor vehicle control apparatus to initially store each data set three times and to check the identity of the data sets of such a three-fold group during diagnostics. In the event that a data set of a group does not agree with the other two data sets of a group, the two agreeing data sets are recognized as being valid to facilitate temporary continued operation of the vehicle. In addition, an error message is issued, for example by switching-on an error lamp, to notify the user that a memory error is present in the system. The control apparatus having the memory error must then be replaced since such an error is an internal system defect which cannot be corrected either by the user or, for example, by a motor vehicle repair-shop.

Although this provides sufficient protection in the event of a flipping of storage cells, due to the required exchange of the control apparatus concerned and the associated visit to the repair-shop, it requires substantial effort and causes inconvenience to the user.

The technical problem underlying the invention concerns overcoming these disadvantages.

SUMMARY OF THE INVENTION

This problem is solved by a method for automatic recognition and correction of an invalid data set stored in a programmable circuit memory which is part of a group of at least three identical stored data sets, wherein:

a) the data sets in the group are compared to each other;

b) in the event of a lack of agreement of one of the data sets of the group with the remaining data sets of the group this set is identified as being invalid and the remaining agreeing data sets of the group are identified as being valid; and c) the invalid data set is corrected through replacement with a valid data set.

This solution has the following advantages:

a flipping of a storage cell no longer leads to a system error;

the control apparatus involved no longer needs to be replaced;

the necessity of going to a repair-shop is eliminated; and an operation mode of reduced safety, occurring in prior art in the time period between the flipping of a storage cell and the subsequent required replacement of the control apparatus, is avoided.

In general this requires less effort, is more convenient to the user and facilitates an additional increase in safety.

A particularly simple correction of the invalid data set is facilitated by writing the new valid data set into the same storage cell in which the invalid one is located.

Alternatively, the new valid data set can also be stored in another storage cell. This is somewhat more difficult since it also requires a change in the correlation table which indicates in which storage cells which data sets are located. On the other hand it provides increased protection in that renewed flipping is less likely therein than in the original storage cell which could be defective. It is advantageous not to store to a data cell which has flipped once (or a plurality of times).

In order to further reduce the probability of repetitive flipping, one chooses the other storage cell preferentially within another area of the storage component or in another storage component. Since the probability of error is spatially correlated due to manufacturing error and soiling, a storage cell located in a spatially removed area or in another storage component will flip less often than an adjacent one. The other storage component can, for example, also be part of a microcontroller in the same control apparatus or can be present in another control apparatus if networking is available.

It is advantageous to repeat the recognition and correction method for different groups of identical stored data sets. With the example of a motor vehicle control apparatus, one preferentially checks all stored data sets during self-diagnosis when switching-on the system or during operation.

In the repetitive method it is particularly advantageous to combine the two above mentioned alternative means for replacing the invalid data sets (namely reprogramming the same storage cell or storage to another storage cell). One initially allows for the same storage cell to be reprogrammed a plurality of times, wherein one counts, for each storage cell, the frequency with which this occurs. In the event that this number exceeds a prescribed maximum number of correction cycles for this individual storage cell, same is no longer reprogrammed. The new data set is then stored in another storage cell, in particular in another area of the storage component or in another storage component. The general case provides each storage cell with its own individual maximum number, although the same maximum number could also be assigned to all storage cells. In an alternative configuration, the number of correction cycles for each storage cell is, as above, counted; when the maximum number is exceeded an error message is issued and, if appropriate, processing is interrupted. The apparatus must then be replaced.

In special cases a very large total number of correction cycles can occur, for example, in one or in a plurality of damaged storage components. In order to recognize this it is advantageous to count the entire number of correction cycles in the system (i.e. the sum of the correction cycles for the individual cells is formed) and in the event that same exceeds a maximum number prescribed therefor, an error message is issued and, if appropriate, processing is interrupted. The apparatus concerned must also be replaced in this case.

The invention is also directed to a system for carrying out the above method comprising:

a programmable circuit memory;

means for comparing the data sets of a group;

means adapted for recognizing a data set of the group as invalid in the event that same does not agree with the remaining data sets of a group and for identifying the remaining agreeing data sets as valid; and means for correcting the invalid data set through replacement with a valid data set.

In principle, the system can be built-up from a plurality of "hard-wired" functional units for carrying out the tasks of comparison, recognition and correction of data sets, counting of correction cycles, issuance of error messages or interruption of processing. However, it is preferred when these means are formed by at least one suitable programmed microcomputer. The storage area itself can constitute a part of this microcomputer. The microcomputer can also comprise one or a plurality of microcontrollers. In this case the storage medium can even be in a component integrated in a processor carrying out one of the above tasks.

Further preferred embodiments of this system are given in the dependent system claims. Details of same can be found in the above discussion.

The invention is now described in greater detail using embodiments and the enclosed schematic drawing.

DESCRIPTION OF THE PREFERRED EMBODIMENT

Figure 1:
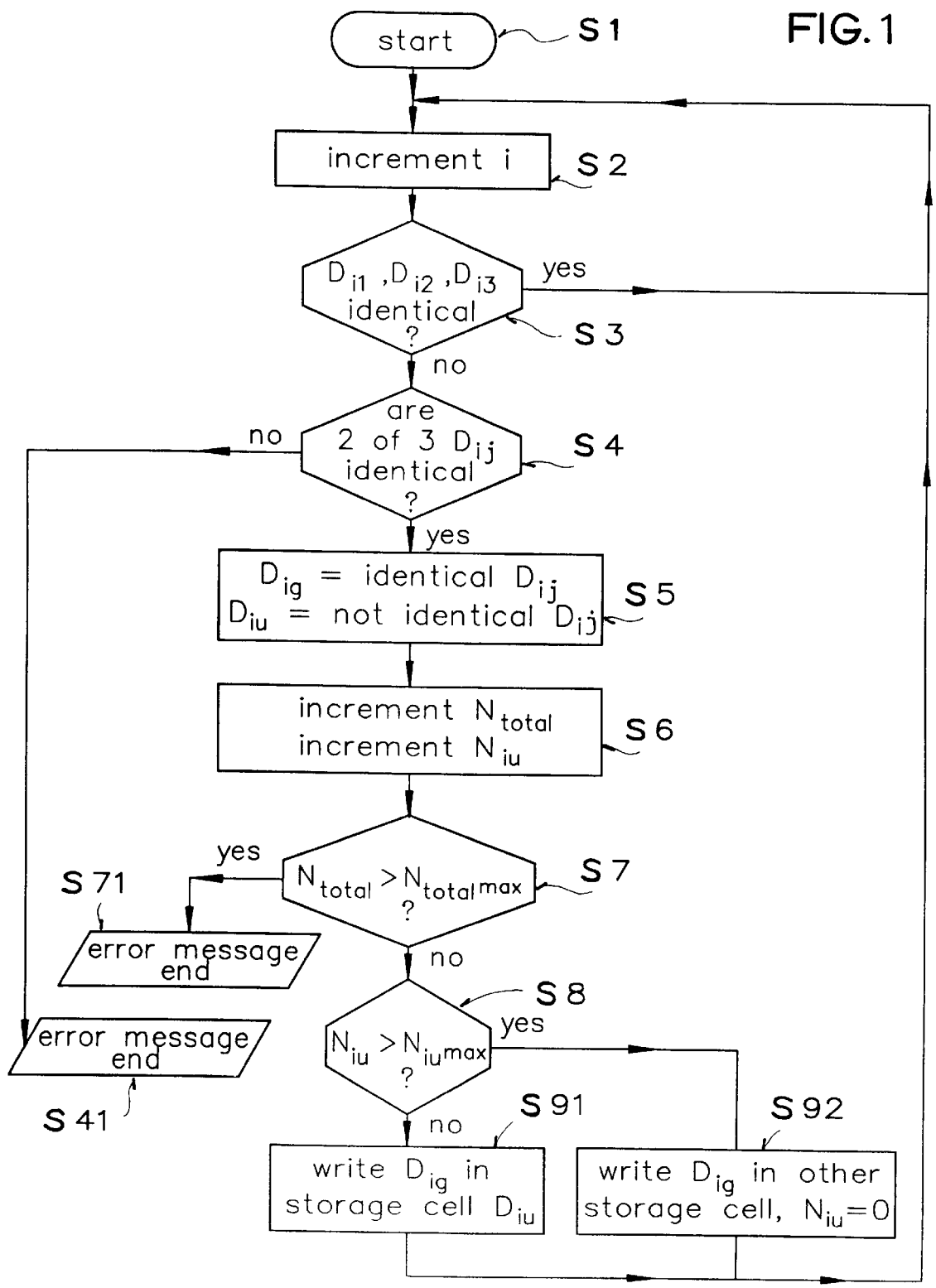
FIG. 1 shows a flow chart of a recognition and correction method, in particular, for use in a motor vehicle control apparatus.

The method according to FIG. 1 leads to an infinite loop following the start (step 1) and an initialization (not shown; i.e. setting to zero) of an index i, which labels the currently processed data set group.

In the first step S2 of this infinite loop the group index i is incremented, i.e. increased by one. It is not increased further when the total number of groups is reached, rather is reset to one.

In the subsequent recognition part of the method, the three data set groups $D_{i1}$, $D_{i2}$, $D_{i3}$ of the group i are compared to each other in step S3. In the event of identity—the usual case—no flipping has occurred. One passage through the infinite loop is thereby ended and program control again passes to the beginning of the above step S2 for processing of the next group.

If on the other hand one or two of the storage cells have flipped, that is to say, if "non-identity" is discovered in step S3, a further comparison step S4 follows. In this step one checks if at least two of the three data sets of the group i are identical. If this is not the case, i.e. if two storage cells have flipped, the infinite loop is exited at this position. An appropriate error message is then issued in step S41 and processing is interrupted.

If, however,—which is usually the case—at least two of the at least three data sets are identical, i.e. in the event that only one storage cell has flipped, the two agreeing data sets are recognized in step S5 as being valid $D_{ig}$ and the other data set which does not agree with them as being invalid $D_{iu}$.

In the subsequent correction part of the method, a counter $N_{total}$ for the total number of correction cycles and a counter $N_{iu}$ for the number of correction cycles of the storage cell containing the invalid data set are each incremented in step S6. Before the control apparatus is placed into operation for the first time, the counter $N_{total}$ and all counters $N_{iu}$ are initialized.

The next step S7 asks whether the entire number of correction cycles $N_{total}$ exceeds a maximum number $N_{total,max}$ prescribed therefor. If yes, then the control apparatus is defective and the infinite loop is exited at this location. In the then subsequent step S71, an appropriate error message is produced and processing is terminated.

If no, step S8 asks whether the number N of correction cycles for the storage cell concerned exceeds a maximum number $N_{iu,max}$ prescribed therefor. This maximum number $N_{iu,max}$ is preferably the same for all storage cells and can have a value between two to six, preferentially the value three.

In the event that the answer in step S8 is "no" the following step S91 writes the data set $D_{ig}$, recognized as being valid, into the storage cell in which the invalid data set is located. Processing of the infinite loop is thereby ended and control again passes to the beginning of step S2 for treatment of the next group.

If, on the other hand, the response in step S8 is "yes" the following step S92 writes the recognized valid data set $D_{ig}$ into another storage cell and the counter $N_{iu}$ is set to zero. A correlation table which indicates which data set is stored in which storage cell is appropriately changed in accordance with the change of the storage cell. It is also advantageous to record those storage cells which have been evaluated in this fashion in a control table and to guarantee during further processing by examination of this table in each case that such storage cells remain unused. After completion of step S92 one pass through the infinite loop is completed and control again passes to the beginning of step S2 for processing of the next group.

In an alternative embodiment (not shown) an error message can be issued instead of the step S92 and the method can be terminated.

Figure 2:
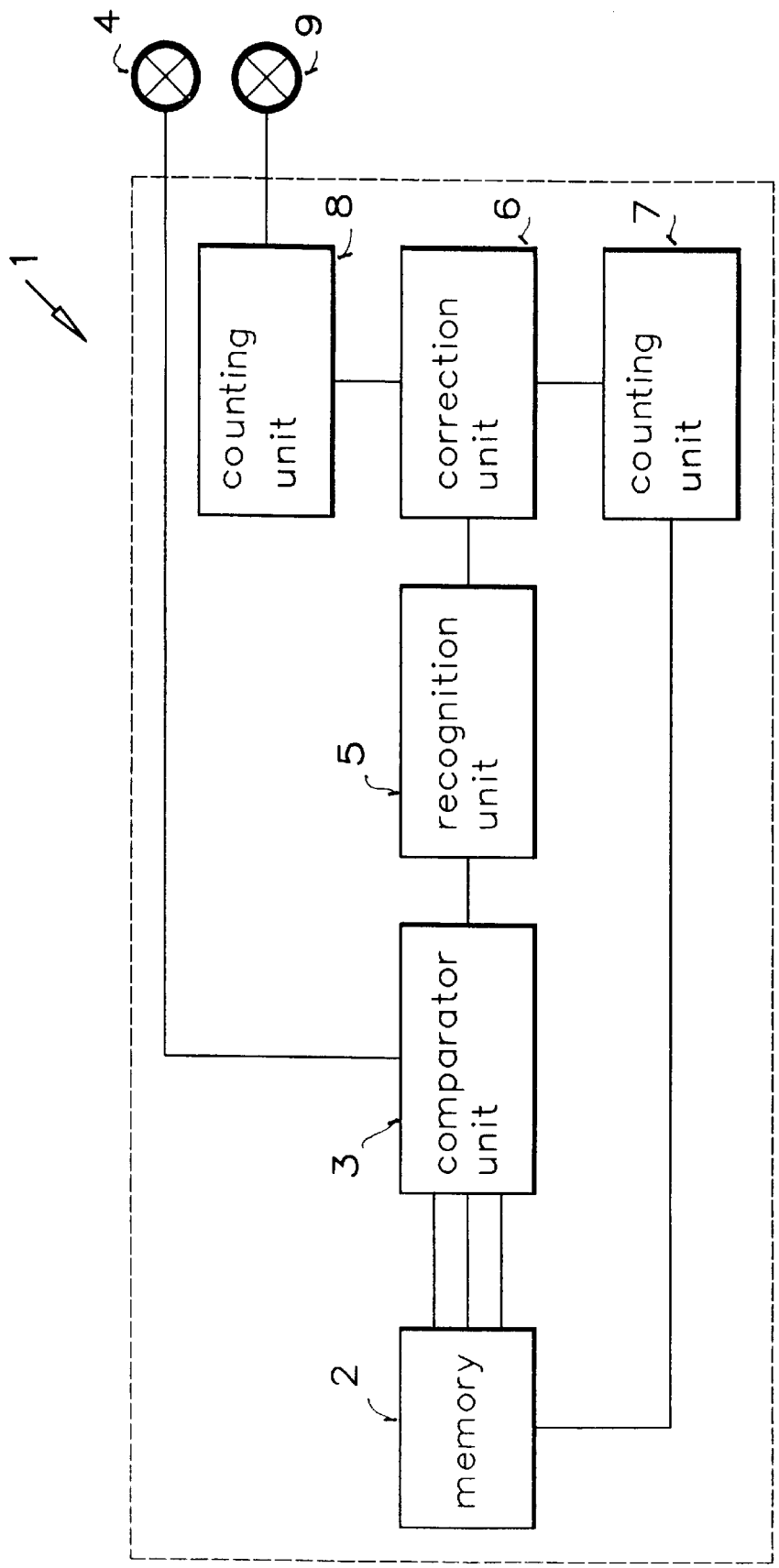
FIG. 2 shows a block diagram of a recognition and correction system which, in particular, constitutes a part of a motor vehicle control apparatus.

The recognition and correction system 1 shown in FIG. 2 is an example of a system made from hard-wired functional units. It has a non-volatile programmable circuit memory 2 which is, for example, formed by one or more EEPROMs, combined EEPROM-SRAM or battery-buffered SRAM-components. Data can be stored therein in groups of three identical data sets.

The memory 2 is coupled to a means 3 for comparing the data sets of a group, in this case, a comparator unit. This can drive an error display 4 in order to indicate the rare case of two flipped storage cells within a group. The comparator unit 3 is coupled to a means 5, in this case a recognition unit, which identifies a data set of a group which is not in correspondence with the remaining ones in the group as being invalid and the others as being valid. The recognition unit 5 is coupled to a means 6 for correcting the invalid data set, in this case a correction unit, which is coupled to the memory 2 via a means 7 for counting, in this case a counting unit. The correction unit 7 initially corrects a data set recognized as being invalid by writing a valid data set in the same storage cell. The first counting unit 7 thereby counts how often this occurs for a particular storage cell and when a maximum number is exceeded, causes the valid data set to be written to another storage cell. In order to be able to limit the total number of correction cycles, the correction unit 6 is also coupled to a means for counting 8, here a second counting unit, which can drive a second error display 9. The system 1 is configured in such a fashion that it is suitable for carrying out the method of FIG. 1.

An alternative embodiment of the system (not shown) exhibits a microcomputer instead of the units 3, 5, 6, 7 and 8, which is programmed in such a fashion that it can carry out the method of figure one. It can also perform other functions in addition to those for carrying out the method and, for example, could be a control apparatus microcomputer.

We claim:

1. A method for automatic recognition and correction of an invalid data set stored in a programmable circuit memory and part of a group of at least three identical stored data sets, the method comprising:

a) comparing the data sets of the group of each other;

b) recognizing a data set of the group which does not agree with other data sets of the group as being invalid and recognizing remaining agreeing data sets of the group as being valid; and c) correcting the invalid data set through replacement with a new valid data set, wherein said new valid data set is stored in another storage cell.

2. The method of claim 1, wherein said other storage cell is located in another area of a storage component or in another storage component.

3. The method of claim 1 further comprising repeating the method for different groups.

4. A method for automatic recognition and correction of an invalid data set stored in a programmable circuit memory and part of a group of at least three identical stored data sets, the method comprising:

a) comparing the data sets of the group to each other;

b) recognizing a data set of the group which does not agree with other data sets of the group as being invalid and recognizing remaining agreeing data sets of the group as being valid;

c) correcting the invalid data set through replacement with a new valid data set by reprogramming a storage cell in which the invalid data set is located, and d) counting a total number of times step c) is executed and determining an error status when a maximum number is exceeded.

5. The method of claim 4, wherein step c) comprises reprogramming a storage cell in which the invalid data set is located and step d) comprises counting a number of times step c) is executed for each individual storage cell, and when said number exceeds a maximum number prescribed for said storage cell, further comprising storing said new valid data set in another storage cell.

6. The method of claim 4, wherein step c) comprises reprogramming a storage cell in which the invalid data set is located and further comprising issuing an error message when said total number exceeds a maximum number prescribed for said storage cell.

7. A system for automatic recognition and correction of an invalid data set stored in a programmable circuit memory and part of a group of at least three identical stored data sets the system comprising:

a programmable circuit memory:

means for comparing the data sets of the group;

means for recognizing the invalid data set of the group as being invalid when same does not agree with remaining data sets of the group and for recognizing remaining agreeing data sets as being valid; and means for correcting the invalid data set through replacement with a valid data set, wherein said means for correcting comprises means for replacing the invalid data set by storing said replacement valid data set in another storage cell.

8. The system of claim 7 further comprising means for repetitive recognition and correction of invalid data sets of different groups.

9. A system for automatic recognition and correction of an invalid data set stored in a programmable circuit memory and part of a group of at least three identical stored data sets, the system comprising:

a programmable circuit memory;

means for comparing the data sets of the group;

means for recognizing the invalid data set of the group as being invalid when same does not agree with remaining data sets of the group and for recognizing remaining agreeing data sets as being valid;

means for correcting the invalid data set through replacement with a valid data set, said means for correcting comprising means for replacing the invalid data set by reprogramming a storage cell in which same is located, and means for counting a total number of times a correction is carried out and for determining an error status in the event that a maximum number prescribed for said total number of times is exceeded.

10. The system of claim 9, wherein said means for correcting comprises means for replacing the invalid data set by reprogramming a storage cell in which same is located, and said means for counting and determining comprise means for counting a number of times in which a correction is carried out for each individual storage cell and, in the event that a maximum number prescribed therefor is exceeded, further comprising means for storing said replacement valid data set in another storage cell.

11. The system of claim 9, wherein said means for correcting comprises means for replacing the invalid data set by reprogramming a storage cell in which same is located, and said means for counting and determining comprises means for counting a number of times in which a correction is carried out for each individual storage cell and means for issuing an error message in the event that a maximum number prescribed for said number of items is exceeded.

12. The system of claim 9, further comprising a programmed microcomputer, wherein said microcomputer comprises at least one of said means for comparing, said means for recognizing, and said means for correcting.

13. The system of claim 12, wherein said microcomputer further comprises at least one of a correction counting means, an error message issuing means, and a processing termination means.

* * * * *

UNITED STATES PATENT AND TRADEMARK OFFICE
CERTIFICATE OF CORRECTION

PATENT NO. : 5,812,565
DATED : 22 September 1998
INVENTOR(S) : Günter Fendt, Peter Hora, Hans Spies, Guido Wetzel, Derrick Zechmair On the title page, Item [73]Assignee, Please replace "Temic Telefunken Micro-Electric" with --Temic Telefunken Microelectronic GmbH--

In claim 1:

Please replace in step a) "of each other" with --to each other--

Signed and Sealed this

Eighth Day of June, 1999

Attest:

Q. TODD DICKINSON

Attesting Officer

Acting Commissioner of Patents and Trademarks